United States Patent

Huang et al.

(10) Patent No.: US 9,716,087 B1
(45) Date of Patent: Jul. 25, 2017

(54) SEMICONDUCTOR ELECTROSTATIC DISCHARGE PROTECTION CIRCUIT, ESD PROTECTION SEMICONDUCTOR DEVICE, AND LAYOUT STRUCTURE OF ESD PROTECTION SEMICONDUCTOR DEVICE

(71) Applicant: UNITED MICROELECTRONICS CORP., Hsin-Chu (TW)

(72) Inventors: Chung-Yu Huang, Tainan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/257,933

(22) Filed: Sep. 7, 2016

(30) Foreign Application Priority Data

Aug. 8, 2016 (TW) .............................. 105125095 A

(51) Int. Cl.
*H01L 27/02* (2006.01)

(52) U.S. Cl.
CPC ................................ *H01L 27/0262* (2013.01)

(58) Field of Classification Search
CPC ............... H01L 27/026; H01L 27/0262; H01L 27/7816; H01L 29/0869; H01L 29/0619
See application file for complete search history.

(56) References Cited

U.S. PATENT DOCUMENTS

| 8,530,969 | B2 | 9/2013 | Chen et al. | |
|---|---|---|---|---|
| 2005/0133868 | A1* | 6/2005 | Su | H01L 29/7436 257/355 |
| 2014/0027856 | A1* | 1/2014 | Chao | H01L 27/027 257/355 |
| 2014/0284720 | A1* | 9/2014 | Chen | H01L 29/78 257/355 |

OTHER PUBLICATIONS

Lin et al., Title of Invention: Electrostatic Discharge Protection Device, U.S. Appl. No. 14/728,053, filed Jun. 2, 2015.
Huang et al., Title of Invention: ESD UNIT, U.S. Appl. No. 14/924,975, filed Oct. 28, 2015.

* cited by examiner

*Primary Examiner* — Phuc Dang
(74) *Attorney, Agent, or Firm* — Winston Hsu

(57) ABSTRACT

An electrostatic discharge protection semiconductor device includes a substrate, a first well formed in the substrate, a second well formed in the substrate and spaced apart from the first well, a gate formed on the substrate and positioned in between the first well and the second well, a drain region formed in the first well, a source region formed in the second well, a first doped region formed in the first well and adjacent to the drain region, and a second doped region formed in the first well and spaced apart from both the first doped region and the gate. The first well, the drain region, and the source region include a first conductivity type, the second well, the first doped region and the second doped region include a second conductivity type, and the first conductivity type and the second conductivity type are complementary to each other.

16 Claims, 5 Drawing Sheets

SEMICONDUCTOR ELECTROSTATIC DISCHARGE PROTECTION CIRCUIT, ESD PROTECTION SEMICONDUCTOR DEVICE, AND LAYOUT STRUCTURE OF ESD PROTECTION SEMICONDUCTOR DEVICE

BACKGROUND OF THE INVENTION

1. Field of the Invention

The present invention relates to an electrostatic discharge (hereinafter abbreviated as ESD) protection circuit, an ESD protection semiconductor device, and a layout structure of an ESD protection semiconductor device, and more particularly, to an ESD protection circuit including an ESD protection semiconductor device and a layout structure of the ESD protection semiconductor device.

2. Description of the Prior Art

With the advancement of technology, the development of semiconductor process is ongoing. A modern chip is therefore allowed to have a plurality of various electronic circuits configured within. For example, the integrated circuits (hereinafter abbreviated as ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for the core circuits and the I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip(s), and this unwanted condition is named electrostatic discharge (ESD). As products based on ICs become more delicate, they also become more vulnerable to the impacts from external environment. And thus, it is assumed that ESD is a constant threat to the modern electronics. As a countermeasure against to the ESD issue, there have been proposed ESD protection circuits/devices. Typically, during a normal IC operation, the ESD protection device is turned off. However when an ESD event occurs, the ESD protection device must be quickly triggered, so that the ESD current is immediately bypassed from the inner circuit.

Typically, when a voltage across the ESD protection device/circuit is higher than trigger voltage (Vt1), snapback breakdown occurs and the voltage is clamped. In other words, when snapback breakdown occurs, the voltage across the circuit drops down to the holding voltage. It is found the low holding voltage leads better robustness. However, a problem arises when the holding voltage is lower than the operating voltage (Vdd) at which the ESD protection device/circuit operates: it is easily latched-up and thus cannot provide protection to the internal circuit. In order to solve the latch-up issue, a stacked ESD device has been introduced. Despite having a relatively high holding voltage, the stacked ESD device is formed by a plurality of gate-grounded n-type metal-oxide-semiconductor (nMOS) transistors electrically connected in series, thereby requiring larger layout area.

SUMMARY OF THE INVENTION

According to the claimed invention, an ESD protection circuit is provided. The ESD protection circuit includes a first pnp-bipolar junction transistor (hereinafter abbreviated as pnp-BJT) and a silicon controlled rectifier (hereinafter abbreviated as SCR). The SCR is electrically connected to the first pnp-BJT in parallel. And the first pnp-BJT is turned on before the SCR in an ESD event.

According to the claimed invention, an ESD protection semiconductor device is provided. The ESD protection semiconductor device includes a substrate, a first well formed in the substrate, a second well formed in the substrate and spaced apart from the first well, a gate formed on the substrate and positioned in between the first well and the second well, a drain region formed in the first well, a source region formed in the second well, a first doped region formed in the first well and adjacent to the drain region, and a second doped region formed in the first well and in between the first doped region and the gate. And the second doped region is spaced apart from both the first doped region and the gate. The first well, the drain region and the source region include a first conductivity type. The second well, the first doped region and the second doped region include a second conductivity type. And the second conductivity type is complementary to the first conductivity type.

According to the claimed invention, a layout structure of an ESD protection semiconductor device is provided. The layout structure of the ESD protection semiconductor device includes a substrate, a first well formed in the substrate, a second well formed in the substrate and spaced apart from the first well, a plurality of fins formed on the substrate, a gate formed on the substrate, a plurality of drain segments respectively formed in the fins at a first side of the gate, a plurality of source segments respectively formed in the fins at a second side of the gate opposite to the first side, a plurality of first doped segments respectively formed in the fins at the first side, and a plurality of second doped segments respectively formed in the fins at the first side. And the second doped segments are spaced apart from the first doped segments and the gate. The first well, the drain segments and the source segments include a first conductivity type. The second well, the first doped segments and the second doped segments include a second conductivity type. And the second conductivity type is complementary to the first conductivity type. The fins are extended along a first direction and arranged along a second direction, and the first direction and the second direction are perpendicular. The gate is extended along the second direction, and the gate covers a portion of each fin, a portion of the first well and a portion of the second well.

According to the ESD protection semiconductor device and the layout structure of the ESD protection semiconductor device provided by the present invention, the first doped region and the second doped region, which are both formed in the first well and include conductivity type complementary to the first well are provided. Thus, a parasite BJT is formed by the first doped region, the first well and the second doped region. Furthermore, a SCR is formed by the first doped region, the first well, the second well and the source region. The SCR is electrically connected to the BJT in parallel and thus an ESD protection circuit is obtained. More important, the BJT is always turned on before the SCR in an ESD event. Therefore a portion of the ESD current is bypassed by the BJT. When the voltage is increased, the SCR is then turned on, and thus the holding current of the ESD protection circuit is significantly increased. According to the ESD protection circuit, the ESD protection semiconductor device and the layout structure of the ESD protection semiconductor device provided by the present invention, higher holding current and lower trigger voltage are obtained, and latch-up immunity is consequently improved without increasing layout area.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
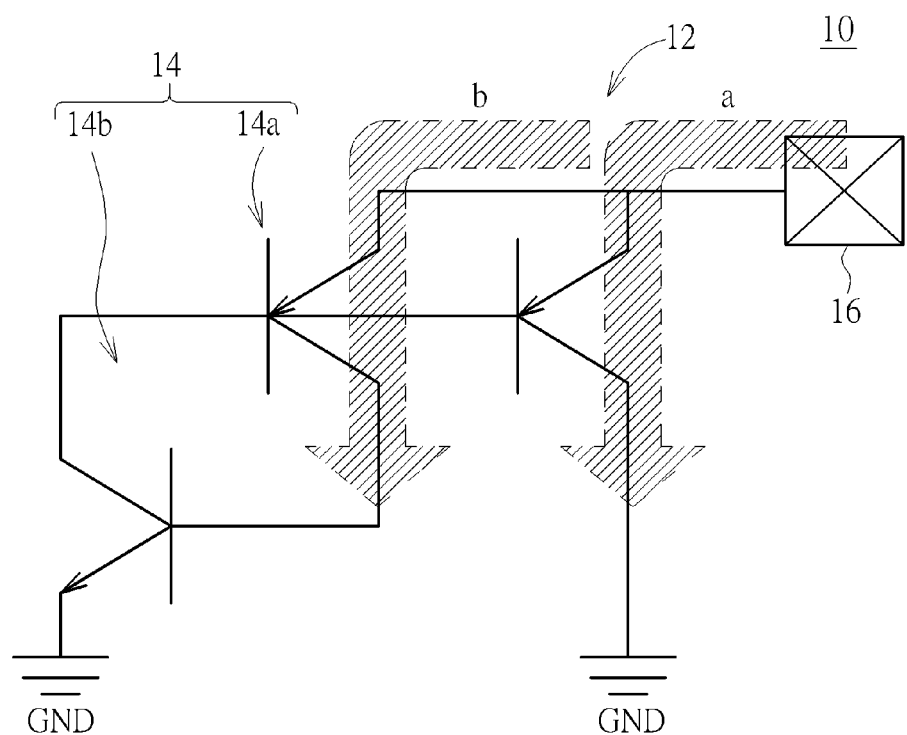
FIG. 1 is a circuit diagram of an ESD protection circuit provided by the present invention.

Please refer to FIG. 1, which is a circuit diagram of an ESD protection circuit provided by the present invention. As shown in FIG. 1, the present invention provides an ESD protection circuit 10 including a first pnp-BJT 12 and a SCR 14, and the SCR 14 is electrically connected to the first pnp-BJT 12 in parallel. In detail, the SCR 14 includes a second pnp-BJT 14a and an npn-BJT 14b. Therefore the SCR 14 provided by the embodiments of the present invention is a pnpn-SCR. An emitter of the first pnp-BJT 12 is electrically connected to a pad 16, such as an I/O pad or a VDD pad, a base of the first pnp-BJT 12 is electrically connected to a base of the second pnp-BJT 14a of the SCR 14, and a collector of the first pnp-BJT 12 is electrically is grounded. An emitter of the second pnp-BJT 14a of the SCR 14 is electrically to the pad 16, the base of the second pnp-BJT 14a is electrically connected to not only the base of the first pnp-BJT 12 but also a collector of the npn-BJT 14b of the SCR 14, and a collector of the second pnp-BJT 14a is electrically connected to a base of the npn-BJT 14b. Furthermore, an emitter of the npn-BJT 14b is grounded, as shown in FIG. 1.

Please still refer to FIG. 1. The emitter of the first pnp-BJT 12 and the emitter of the second pnp-BJT 14a are electrically connected in parallel, and both are electrically connected to the pad 16. In other words, the emitter of the first pnp-BJT 12 and an anode of the SCR 14 are electrically connected to the pad 16. More important, the first pnp-BJT 12 can be turned on before the SCR in an ESD event by the device configuration described in the following specification. Consequently, portions of ESD current are bypassed and grounded, and thus the SCR 14, which is turned on after the first pnp-BJT 12, obtains a higher holding current, and thus latch-up immunity of the ESD protection circuit is improved.

Figure 2A:
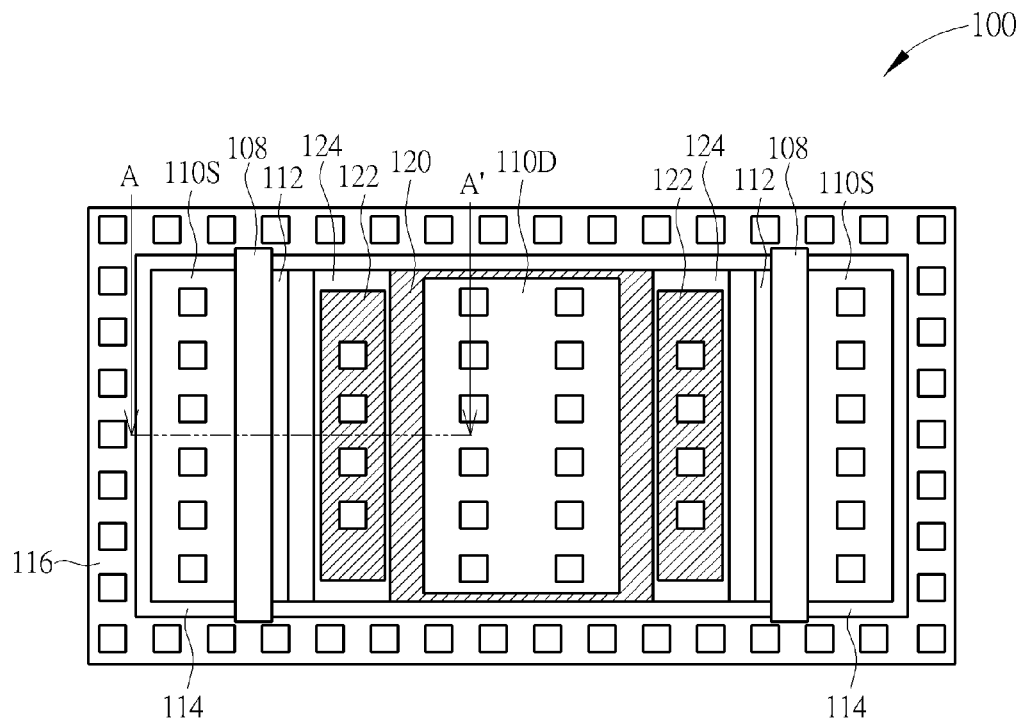
FIG. 2A is a schematic drawing illustrating a layout structure of an ESD protection semiconductor device provided by a first preferred embodiment of the present invention.
Figure 2B:
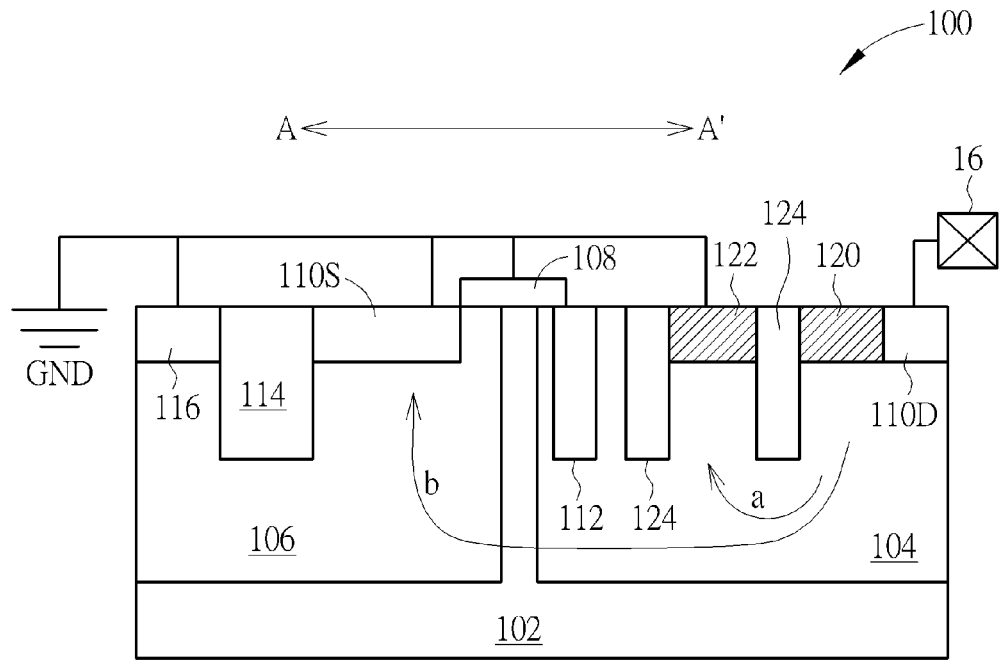
FIG. 2B is a schematic drawing illustrating the ESD protection semiconductor device provided by the first preferred embodiment, and a cross-sectional view taken along a line A-A' of FIG. 2A.

Please refer to FIGS. 2A and 2B, wherein FIG. 2A is a schematic drawing illustrating a layout structure of an ESD protection semiconductor device provided by a first preferred embodiment of the present invention, and FIG. 2B is a schematic drawing illustrating the ESD protection semiconductor device provided by the first preferred embodiment, and a cross-sectional view taken along a line A-A' of FIG. 2A. As shown in FIGS. 2A and 2B, the preferred embodiment provides an ESD protection semiconductor device 100. The ESD protection semiconductor device 100 includes a substrate 102 (shown in FIG. 2B), and the substrate 102 includes a first well 104 and a second well 106 formed therein. And the first well 104 and the second well 106 are spaced apart from each other by the substrate 102 as shown in FIG. 2B. It is noteworthy that the first well 104 includes a first conductivity type, the substrate 102 and the second well 106 include a second conductivity type, and the first conductivity type and the second conductivity type are complementary to each other. In some embodiments of the present invention, the first conductivity type is an n type and the second conductivity type is a p type. However, it should be easily realized by those skilled in the art that in other embodiments of the present invention, the first conductivity type can be a p type and the second conductivity type can be an n type. A gate 108 is formed on the substrate 102. Particularly, the gate 108 is positioned in between the first well 104 and the second well 106. And as shown in FIG. 2B, the gate 108 overlaps a portion of the first well 104 and a portion of the second well 106.

Please still refer to FIGS. 2A and 2B. The ESD protection semiconductor device 100 further includes a drain region 110D formed in the first well 104 and a source region 110S formed in the second well 106. In the preferred embodiment, the drain region 110D and the source region 110S include the first conductivity type. That is, the preferred embodiment of the present invention provides an n-drain region 110D and an n-source region 110S. It is also noteworthy that the ESD protection semiconductor device 100 includes isolation structures 112 and 114, and a pick-up region 116. In the preferred embodiment, the isolation structures 112 and 114 respectively can include a shallow trench isolation (hereinafter abbreviated as STI), but not limited to this. The isolation structure 112 is disposed in the first well 104, and the gate 108 overlaps a portion of the isolation structure 112. The pick-up region 116 includes the second conductivity type. It is noteworthy that the pick-up region 116 is disposed in the second well 106, however the pick-up region 116 is spaced apart from the source region 110S by the isolation structure 114. More important, the ESD protection semiconductor device 100 further includes a first doped region 120 and a second doped region 122, and both of the first doped region 120 and the second doped region 122 include the second conductivity type. A concentration of the first doped region 120, a concentration of the second doped region 122 and a concentration of the pick-up region 116 are the same. The first doped region 120 is formed in the first well 104. Specifically, the first doped region 120 is adjacent to and physically contacts the drain region 110D. As shown in FIG. 2A, the first doped region 120 surrounds the drain region 110D in the layout structure, but not limited to this. The second doped region 122 is also formed in the first well 104, and disposed in between the first doped region 120 and the gate 108. However, it is noteworthy that the second doped region 122 is spaced apart from both the first doped region 120 and the gate 108. As shown in FIGS. 2A and 2B, the second doped region 122 is surrounded by a frame-shaped STI 124 according to the preferred embodiment. Therefore, the second doped region 122 is spaced apart from the first doped region 120 by the STI 124, and the second doped region 122 is spaced apart from the gate 108 by the STI 112, the STI 124 and a portion of the first well 104. In other words, the second doped region 122 and the gate 108 are spaced apart from each other by a blocking structure 112/124, and the blocking structure 112/124 includes a first STI 124 and a second STI 112. As shown in FIGS. 2A and 2B, the first STI 124 and the second doped region 122 are adjacent to each other, and the gate 108 overlaps a portion of the second STI 112.

It is also noteworthy that a metal silicide (not shown) is formed on a surface of the first doped region 120 and a surface of the drain region 110D, so that the first doped region 120 and the drain region 110D, which physically contact each other, are electrically connected to each other. And both of the first doped region 120 and the drain region 110D are electrically connected to a pad 16, such as an I/O pad or a VDD pad, by wirings to be formed in following procedures. In the same concept, the second doped region 122, the gate 108, the source region 110S, and the pick-up region 116 of the ESD protection semiconductor device 100 are electrically connected to a ground pad GND by wirings to be formed in following procedures.

Please refer to both of FIG. 1 and FIG. 2B. When ESD event occurs, the first doped region 120, the first well 104 and the second doped region 122 construct the aforementioned first pnp-BJT 12, while the first doped region 120, the first well 104, the substrate 102/the second well 106, and the source region 110S construct the aforementioned pnpn-SCR 14 (the first doped region 120, the first well 104 and the substrate 102/the second well 106 construct the aforementioned second pnp-BJT 14a, and the first well 104, the substrate 102/the second well 106 and the source region 110S construct the aforementioned npn-BJT 14b). It is noteworthy that because concentrations of the first doped region 120 and the second doped region 122 are higher than a concentration of the first well 104, a breakdown voltage ($V_{BD}$) of the BJT 12 is smaller than a breakdown voltage of the SCR 14, and thus it is ensured that the BJT 12 is always firstly turned on. Consequently, the ESD current is bypassed from the first doped region 120 to the first well 104 and then the second doped region 122, and subsequently to the ground pad GND as the arrow "a" depicted. Thereafter, as the voltage is increased, the SCR 14 is then turned on, and the ESD current is bypassed from the first doped region 120 sequentially to the first well 104, the substrate 102/the second well 106 and the source region 110S, and then to the ground pad GND as the arrow "b" depicted.

It is still noteworthy that in the pnp-BJT 12, by adjusting or modifying a width of the second doped region 122, the On-resistance ($R_{ON}$) of the ESD protection semiconductor device 100 can be reduced.

Figure 3:
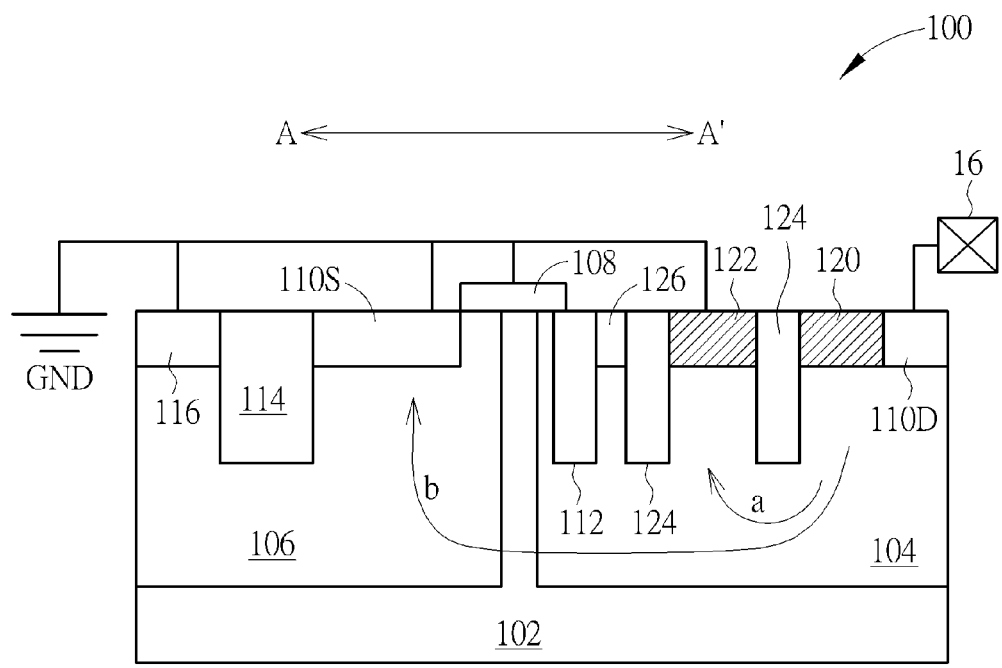
FIG. 3 is a schematic drawing illustrating a modification to the ESD protection semiconductor device provided by the present invention.

Additionally, as shown in FIG. 3, which is a schematic drawing illustrating a modification to the ESD protection semiconductor device provided by the present invention. It should be noted that elements the same in the present modification and the first preferred embodiment are designated by the same numerals and include the same material choice and electrical relationships, therefore those details are omitted for simplicity. As shown in FIG. 3, the difference between the modification and the preferred embodiments is detailed: The second doped region 122 and the gate 108 are spaced apart from each other by a blocking structure, and the blocking structure include a first STI 124, a second STI 112, and a third doped region 126 in between the first STI 124 and the second STI 112. And the third doped region 126 includes the first conductivity type.

According to the ESD protection semiconductor device 100 and its layout structure, the first doped region 120, the first well 104 and the second doped region 122 form the parasite BJT 12 while the first doped region 120, the first well 104, the second well 106/the substrate 102, and the source region 110S form the SCR 14. And the BJT 12 and the SCR 14 are electrically connected in parallel. More important, the BJT 12 is turned on before the SCR 14 in an ESD event. Therefore a portion of the ESD current is bypassed by the BJT 12. When the voltage is increased, the SCR 14 is then turned on, and thus the holding current of the ESD protection circuit 10 is significantly increased. Briefly speaking, according to the ESD protection circuit 10, the ESD protection semiconductor device 100 and the layout structure of the ESD protection semiconductor device 100 provided by the present invention, higher holding current and lower $R_{ON}$ are obtained by the parasite BJT 12 and the SCR 14, and latch-up immunity is consequently improved without increasing layout area.

Figure 4A:
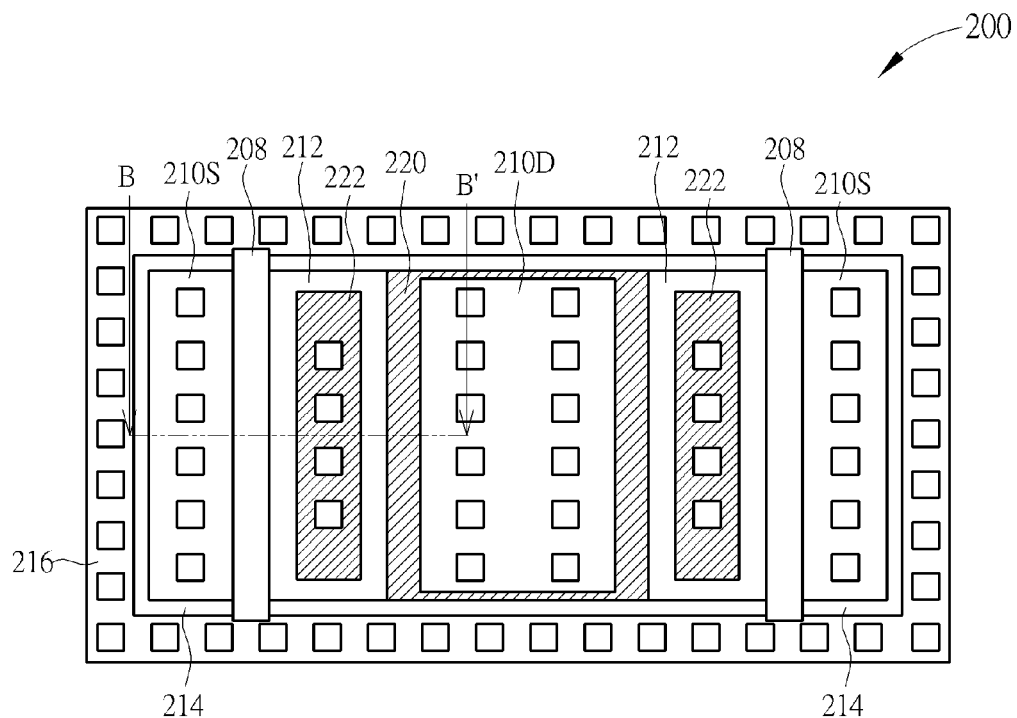
FIG. 4A is a schematic drawing illustrating a layout structure of an ESD protection semiconductor device provided by a second preferred embodiment of the present invention.
Figure 4B:
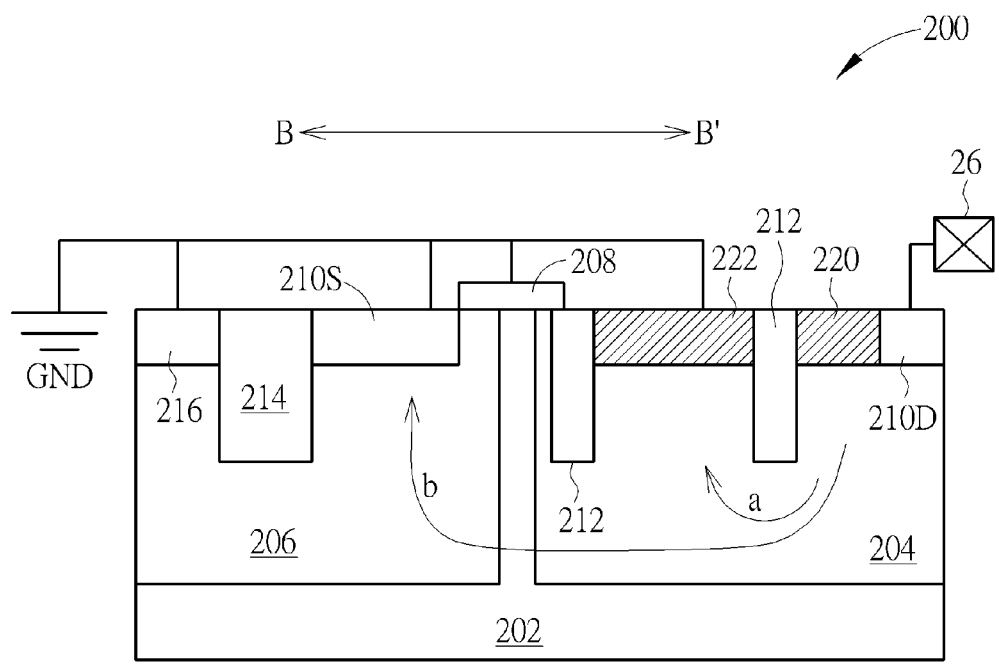
FIG. 4B is a schematic drawing illustrating the ESD protection semiconductor device provided by the second preferred embodiment, and a cross-sectional view taken along a line B-B' of FIG. 4A.

Please refer to FIGS. 4A and 4B, wherein FIG. 4A is a schematic drawing illustrating a layout structure of an ESD protection semiconductor device provided by a second preferred embodiment of the present invention, and FIG. 4B is a schematic drawing illustrating the ESD protection semiconductor device provided by the second preferred embodiment, and a cross-sectional view taken along a line B-B' of FIG. 4A. As shown in FIGS. 4A and 4B, the preferred embodiment provides an ESD protection semiconductor device 200. The ESD protection semiconductor device 200 includes a substrate 202 (shown in FIG. 4B), and the substrate 202 includes a first well 204 and a second well 206 formed therein. And the first well 204 and the second well 206 are spaced apart from each other by the substrate 202 as shown in FIG. 4B. It is noteworthy that the first well 204 includes a first conductivity type, the substrate 202 and the second well 206 include a second conductivity type, and the first conductivity type and the second conductivity type are complementary to each other. In some embodiments of the present invention, the first conductivity type is an n type and the second conductivity type is a p type. However, as mentioned above, in other embodiments of the present invention, the first conductivity type can be a p type and the second conductivity type can be an n type. A gate 208 is formed on the substrate 202. Particularly, the gate 208 is positioned in between the first well 204 and the second well 206. And as shown in FIG. 4B, the gate 208 overlaps a portion of the first well 204 and a portion of the second well 206.

Please still refer to FIGS. 4A and 4B. The ESD protection semiconductor device 200 further includes a drain region 210D formed in the first well 204 and a source region 210S formed in the second well 206. In the preferred embodiment, the drain region 210D and the source region 210S include the first conductivity type. The ESD protection semiconductor device 200 further includes isolation structures 212 and 214, and a pick-up region 216. In the preferred embodiment, the isolation structures 212 and 214 respectively can include a STI, but not limited to this. The isolation structure 212 is disposed in the first well 204, and the gate 208 overlaps a portion of the isolation structure 212. The pick-up region 216 includes the second conductivity type. The pick-up region 216 is disposed in the second well 206, however it is spaced apart from the source region 210S by the isolation structure 214. More important, the ESD protection semiconductor device 200 further includes a first doped region 220 and a second doped region 222, and both of the first doped region 220 and the second doped region 222 include the second conductivity type. A concentration of the first doped region 220, a concentration of the second doped region 222 and a concentration of the pick-up region 216 are the same. The first doped region 220 is formed in the first well 204. Specifically, the first doped region 220 is adjacent to and physically contacts the drain region 210D. As shown in FIG. 4A, the first doped region 220 surrounds the drain region 210D in the layout structure, but not limited to this. The second doped region 222 is also formed in the first well 204, and disposed in between the first doped region 220 and the gate 208. It is noteworthy that the second doped region 222 is spaced apart from both the first doped region 220 and the gate 208. As shown in FIGS. 4A and 4B, the STI 212 is a frame-shaped structure that surrounding the second doped region 222. Therefore, the second doped region 222 is spaced apart from the first doped region 220 by the STI 212, and the second doped region 222 is spaced apart from the gate 208 also by the STI 212.

As mentioned above, a metal silicide (not shown) is formed on a surface of the first doped region 220 and a surface of the drain region 210D, so that the first doped region 220 and the drain region 210D, which physically contact each other, are also electrically connected to each other. And both of the first doped region 220 and the drain region 210D are electrically connected to a pad 16/26, such as an I/O pad or a VDD pad, by wirings to be formed in following procedures. In the same concept, the second doped region 222, the gate 208, the source region 210S, and the pick-up region 216 of the ESD protection semiconductor device 200 are electrically connected to a ground pad GND by wirings to be formed in following procedures.

Please refer to both of FIG. 1 and FIG. 4B. When ESD event occurs, the first doped region 220, the first well 204 and the second doped region 222 construct the aforementioned first pnp-BJT 12, while the first doped region 220, the first well 204, the substrate 202/the second well 206, and the source region 210S construct the aforementioned pnpn-SCR 14 (the first doped region 220, the first well 204 and the substrate 202/the second well 206 construct the aforementioned second pnp-BJT 14a, and the first well 204, the substrate 202/the second well 206 and the source region 210S construct the aforementioned npn-BJT 14b). It is noteworthy that because concentrations of the first doped region 220 and the second doped region 222 are higher than a concentration of the first well 204, a breakdown voltage of the BJT 12 is smaller than a breakdown voltage of the SCR 14, and thus it is ensured that the BJT 12 is always firstly turned on. Consequently, the ESD current is bypassed from the first doped region 220 to the first well 204 and then the second doped region 222, and subsequently to the ground pad GND as the arrow "a" depicted. Thereafter, as the voltage is increased, the SCR 14 is then turned on, and the ESD current is bypassed from the first doped region 220 sequentially to the first well 204, the substrate 202/the second well 206 and the source region 210S, and then to the ground pad GND as the arrow "b" depicted.

It is still noteworthy that in the pnp-BJT 12, by adjusting or modifying a width of the second doped region 222, the $R_{ON}$ of the ESD protection semiconductor device 200 can be reduced.

According to the ESD protection semiconductor device 200 and its layout structure, the first doped region 220, the first well 204 and the second doped region 222 form the parasite BJT 12 while the first doped region 220, the first well 204, the second well 206/the substrate 202, and the source region 210S form the SCR 14. And the BJT 12 and the SCR 14 are electrically connected in parallel. More important, the BJT 12 is turned on before the SCR 14 in an ESD event. Therefore a portion of the ESD current is bypassed by the BJT 12. When the voltage is increased, the SCR 14 is then turned on, and thus the holding current of the ESD protection circuit 10 is significantly increased. Briefly speaking, according to the ESD protection circuit 10, the ESD protection semiconductor device 200 and the layout structure of the ESD protection semiconductor device 200 provided by the present invention, higher holding current and lower $R_{ON}$ are obtained by the parasite BJT 12 and the SCR 14, and latch-up immunity is consequently improved without increasing layout area.

Figure 5:
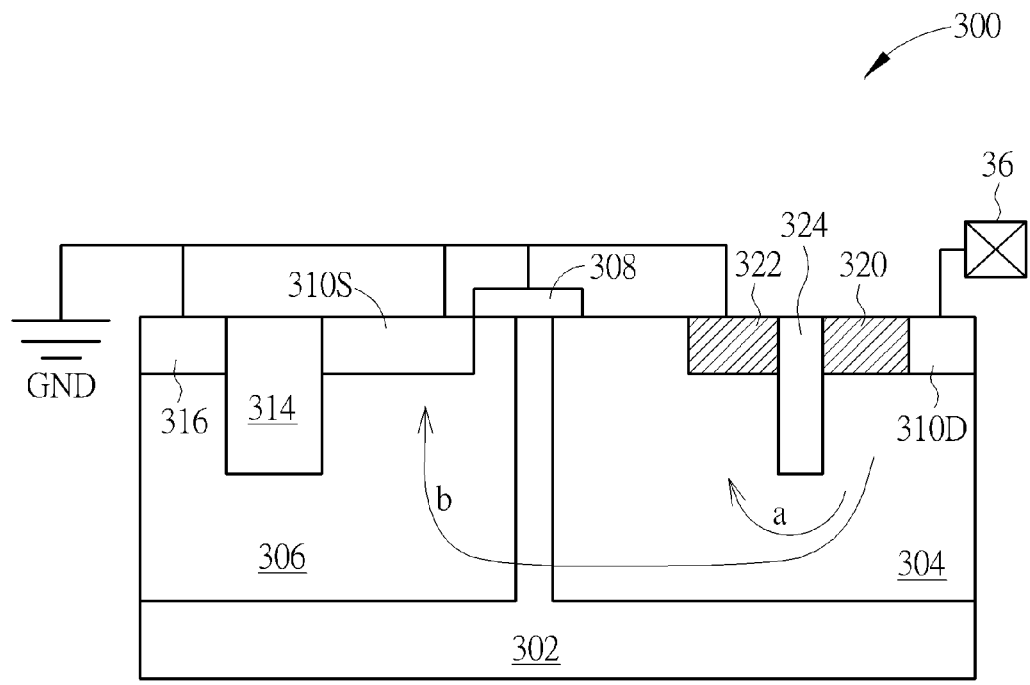
FIG. 5 is a schematic drawing illustrating an ESD protection semiconductor device provided by a third preferred embodiment of the present invention.

Please refer to FIG. 5, which is a schematic drawing illustrating an ESD protection semiconductor device provided by a third preferred embodiment of the present invention. As shown in FIG. 5, the preferred embodiment provides an ESD protection semiconductor device 300. The ESD protection semiconductor device 300 includes a substrate 302, and the substrate 302 includes a first well 304 and a second well 306 formed therein. And the first well 304 and the second well 306 are spaced apart from each other by the substrate 302 as shown in FIG. 5. The first well 304 includes a first conductivity type, the substrate 302 and the second well 306 include a second conductivity type, and the first conductivity type and the second conductivity type are complementary to each other. In some embodiments of the present invention, the first conductivity type is an n type and the second conductivity type is a p type. However, as mentioned above, it is not limited to this. A gate 308 is formed on the substrate 302. Particularly, the gate 308 is positioned in between the first well 304 and the second well 306. And as shown in FIG. 5, the gate 308 overlaps a portion of the first well 304 and a portion of the second well 306.

Please still refer to FIG. 5. The ESD protection semiconductor device 300 further includes a drain region 310D formed in the first well 304 and a source region 310S formed in the second well 306. In the preferred embodiment, the drain region 310D and the source region 310S include the first conductivity type. That is, the preferred embodiment of the present invention provides an n-drain region 310D and an n-source region 310S. It is also noteworthy that the ESD protection semiconductor device 300 includes an isolation structure 314 and a pick-up region 316. In the preferred embodiment, the isolation structure 314 can include a STI, but not limited to this. The pick-up region 316 includes the second conductivity type. The pick-up region 316 and the STI 314 are both disposed in the second well 306, and the pick-up region 316 is spaced apart from the source region 310S by the isolation structure 314. More important, the ESD protection semiconductor device 300 further includes a first doped region 320 and a second doped region 322, and both of the first doped region 320 and the second doped region 322 include the second conductivity type. A concentration of the first doped region 320, a concentration of the second doped region 322 and a concentration of the pick-up region 316 are all the same. The first doped region 320 is formed in the first well 304. Specifically, the first doped region 320 is adjacent to and physically contacts the drain region 310D. As mentioned above, the first doped region 320 surrounds the drain region 310D in the layout structure, but not limited to this. The second doped region 322 is also formed in the first well 304, and disposed in between the first doped region 320 and the gate 308. It is noteworthy that the second doped region 322 is spaced apart from both the first doped region 320 and the gate 308. As shown in FIG. 5, the second doped region 322 is spaced apart from the first doped region 320 by an STI 324, and the second doped region 322 is spaced apart from the gate 308 by a portion of the first well 304.

It is also noteworthy that a metal silicide (not shown) is formed on a surface of the first doped region 320 and a surface of the drain region 310D, so that the first doped region 320 and the drain region 310D, which physically contact each other, are also electrically connected to each other. And both of the first doped region 320 and the drain region 310D are electrically connected to a pad 16/36, such as an I/O pad or a VDD pad, by wirings to be formed in following procedures. In the same concept, the second doped region 322, the gate 308, the source region 310S, and the pick-up region 316 of the ESD protection semiconductor device 300 are electrically connected to a ground pad GND by wirings to be formed in following procedures.

Please refer to both of FIG. 1 and FIG. 5. When ESD event occurs, the first doped region 320, the first well 304 and the second doped region 322 construct the aforementioned first pnp-BJT 12, while the first doped region 320, the first well 304, the substrate 302/the second well 306, and the source region 310S construct the aforementioned pnpn-SCR 14 (the first doped region 320, the first well 304 and the substrate 302/the second well 306 construct the aforementioned second pnp-BJT 14a, and the first well 304, the substrate 302/the second well 306 and the source region 310S construct the aforementioned npn-BJT 14b). It is noteworthy that because concentrations of the first doped region 320 and the second doped region 322 are higher than a concentration of the first well 304, a breakdown voltage of the BJT 12 is smaller than a breakdown voltage of the SCR 14, and thus it is ensured that the BJT 12 is always firstly turned on. Consequently, the ESD current is bypassed from the first doped region 320 to the first well 304 and then the second doped region 322, and subsequently to the ground pad GND as the arrow "a" depicted. Thereafter, as the voltage is increased, the SCR 14 is then turned on, and the ESD current is bypassed from the first doped region 320 sequentially to the first well 304, the substrate 302/the second well 306 and the source region 310S, and then to the ground pad GND as the arrow "b" depicted.

It is still noteworthy that in the pnp-BJT 12, by adjusting or modifying a width of the second doped region 322, the $R_{ON}$ of the ESD protection semiconductor device 300 can be reduced. However, the second doped region 322 is always spaced apart from the gate 308 by the first well 304 in any modification to the preferred embodiment. Consequently, lower $R_{ON}$ is obtained without impacting electrical performance of the ESD protection semiconductor device 300.

According to the ESD protection semiconductor device 300, the first doped region 320, the first well 304 and the second doped region 322 form the parasite BJT 12 while the first doped region 320, the first well 304, the second well 306/the substrate 302, and the source region 310S form the SCR 14. And the BJT 12 and the SCR 14 are electrically connected in parallel. More important, the BJT 12 is turned on before the SCR 14 in an ESD event. Therefore a portion of the ESD current is bypassed by the BJT 12. When the voltage is increased, the SCR 14 is then turned on, and thus the holding current of the ESD protection circuit 10 is significantly increased. Briefly speaking, according to the ESD protection circuit 10 and the ESD protection semiconductor device 300 provided by the present invention, higher holding current and lower $R_{ON}$ voltage are obtained by the parasite BJT 12 and the SCR 14, and latch-up immunity is consequently improved without increasing layout area.

Figure 6:
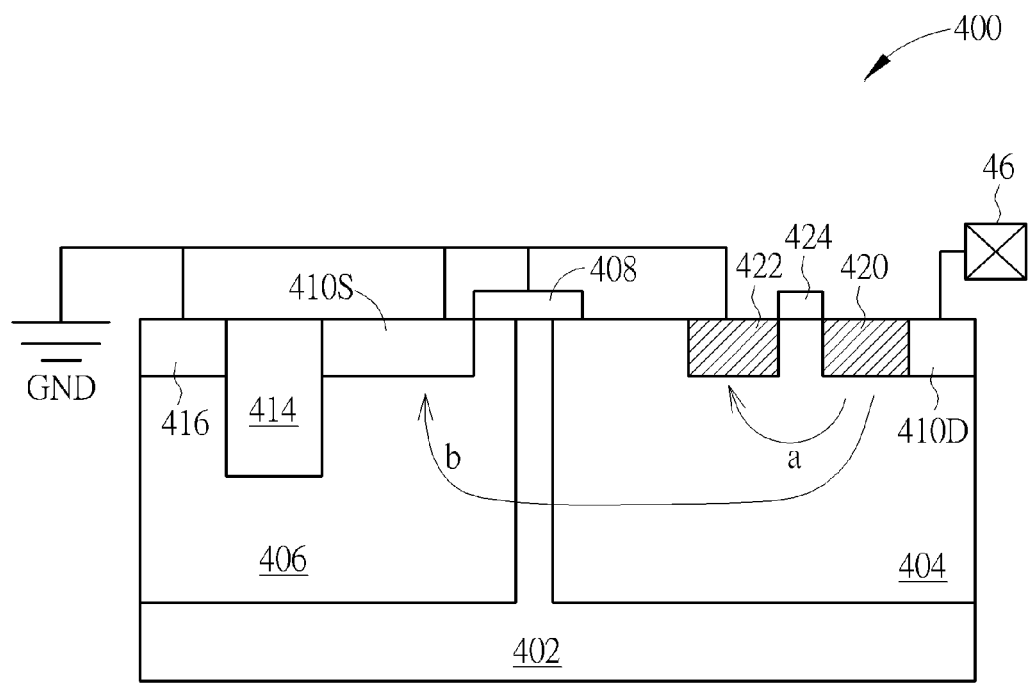
FIG. 6 is a schematic drawing illustrating an ESD protection semiconductor device provided by a fourth preferred embodiment of the present invention.

Please refer to FIG. 6, which is a schematic drawing illustrating an ESD protection semiconductor device provided by a fourth preferred embodiment of the present invention. As shown in FIG. 6, the preferred embodiment provides an ESD protection semiconductor device 400. The ESD protection semiconductor device 400 includes a substrate 402, and the substrate 402 includes a first well 404 and a second well 406 formed therein. And the first well 404 and the second well 406 are spaced apart from each other by the substrate 402 as shown in FIG. 6. The first well 404 includes a first conductivity type, the substrate 402 and the second well 406 include a second conductivity type, and the first conductivity type and the second conductivity type are complementary to each other. In some embodiments of the present invention, the first conductivity type is an n type and the second conductivity type is a p type. However, it is not limited to this as mentioned above. A gate 408 is formed on the substrate 402. Particularly, the gate 408 is positioned in between the first well 404 and the second well 406. And as shown in FIG. 6, the gate 408 overlaps a portion of the first well 404 and a portion of the second well 406.

Please still refer to FIG. 6. The ESD protection semiconductor device 400 further includes a drain region 410D formed in the first well 404 and a source region 410S formed in the second well 406. In the preferred embodiment, the drain region 410D and the source region 410S include the first conductivity type. That is, the preferred embodiment of the present invention provides an n-drain region 410D and an n-source region 410S. The ESD protection semiconductor device 400 further includes an isolation structure 414 and a pick-up region 416. In the preferred embodiment, the isolation structure 414 can include a STI, but not limited to this. The pick-up region 416 includes the second conductivity type. The pick-up region 416 and the isolation structure 414 are disposed in the second well 406, and the pick-up region 416 is spaced apart from the source region 410S by the isolation structure 414. More important, the ESD protection semiconductor device 400 further includes a first doped region 420 and a second doped region 422, and both of the first doped region 420 and the second doped region 422 include the second conductivity type. A concentration of the first doped region 420, a concentration of the second doped region 422 and a concentration of the pick-up region 416 are all the same. The first doped region 420 is formed in the first well 404. Specifically, the first doped region 420 is adjacent to and physically contacts the drain region 410D. As mentioned above, the first doped region 420 surrounds the drain region 410D in the layout structure, but not limited to this. The second doped region 422 is also formed in the first well 404, and disposed in between the first doped region 420 and the gate 408. It is noteworthy that the second doped region 422 is spaced apart from both the first doped region 420 and the gate 408. As shown in FIG. 6, the second doped region 422 is spaced apart from the first doped region 420 by a salicide block (hereinafter abbreviated as SAB) 424. It is noteworthy that the SAB serves as an implant mask and thus no doped region is formed under the SAB. Therefore, as shown in FIG. 6, the second doped region 422 is spaced apart from the first doped region 420 by the SAB 424 and a portion of the first well 404 formed underneath. Additionally, it should be easily realized by those skilled in the art that SAB 424 can be replaced with other elements such as dummy gate, but not limited to this. Furthermore, and the second doped region 422 is spaced apart from the gate 408 by a portion of the first well 404.

As mentioned above, a metal silicide (not shown) is formed on a surface of the first doped region 420 and a surface of the drain region 410D, so that the first doped region 420 and the drain region 410D, which physically contact each other, are also electrically connected to each other. And both of the first doped region 420 and the drain region 410D are electrically connected to a pad 16/46, such as an I/O pad or a VDD pad, by wirings to be formed in following procedures. In the same concept, the second doped region 422, the gate 408, the source region 410S, and the pick-up region 416 of the ESD protection semiconductor device 400 are electrically connected to a ground pad GND by wirings to be formed in following procedures.

Please refer to both of FIG. 1 and FIG. 6. When ESD event occurs, the first doped region 420, the first well 404 and the second doped region 422 construct the aforementioned first pnp-BJT 12, while the first doped region 420, the first well 404, the substrate 402/the second well 406, and the source region 410S construct the aforementioned pnpn-SCR 14 (the first doped region 420, the first well 404 and the substrate 402/the second well 406 construct the aforementioned second pnp-BJT 14a, and the first well 404, the substrate 402/the second well 406 and the source region 410S construct the aforementioned npn-BJT 14b). It is noteworthy that because concentrations of the first doped region 420 and the second doped region 422 are higher than a concentration of the first well 404, a breakdown voltage of the BJT 12 is smaller than a breakdown voltage of the SCR 14, and thus it is ensured that the BJT 12 is always firstly turned on. Consequently, the ESD current is bypassed from the first doped region 420 to the first well 404 and then the second doped region 422, and subsequently to the ground pad GND as the arrow "a" depicted. Thereafter, as the voltage is increased, the SCR 14 is then turned on, and the ESD current is bypassed from the first doped region 420 sequentially to the first well 404, the substrate 402/the second well 406 and the source region 410S, and then to the ground pad GND as the arrow "b" depicted.

It is still noteworthy that in the pnp-BJT 12, by adjusting or modifying a width of the second doped region 422, the $R_{ON}$ of the ESD protection semiconductor device 400 can be reduced. However, the second doped region 422 is always spaced apart from the gate 408 by the first well 404 in any modification to the preferred embodiment. Consequently, lower $R_{ON}$ is obtained without impacting electrical performance of the ESD protection semiconductor device 400.

According to the ESD protection semiconductor device 400, the first doped region 420, the first well 404 and the second doped region 422 form the parasite BJT 12 while the first doped region 420, the first well 404, the second well 406/the substrate 402, and the source region 410S form the SCR 14. And the BJT 12 and the SCR 14 are electrically connected in parallel. More important, the BJT 12 is turned on before the SCR 14 in an ESD event. Therefore a portion of the ESD current is bypassed by the BJT 12. When the voltage is increased, the SCR 14 is then turned on, and thus the holding current of the ESD protection circuit 10 is significantly increased. Briefly speaking, according to the ESD protection circuit 10 and the ESD protection semiconductor device 400 provided by the present invention, higher holding current and lower $R_{ON}$ are obtained by the parasite BJT 12 and the SCR 14, and latch-up immunity is consequently improved without increasing layout area.

Figure 7:
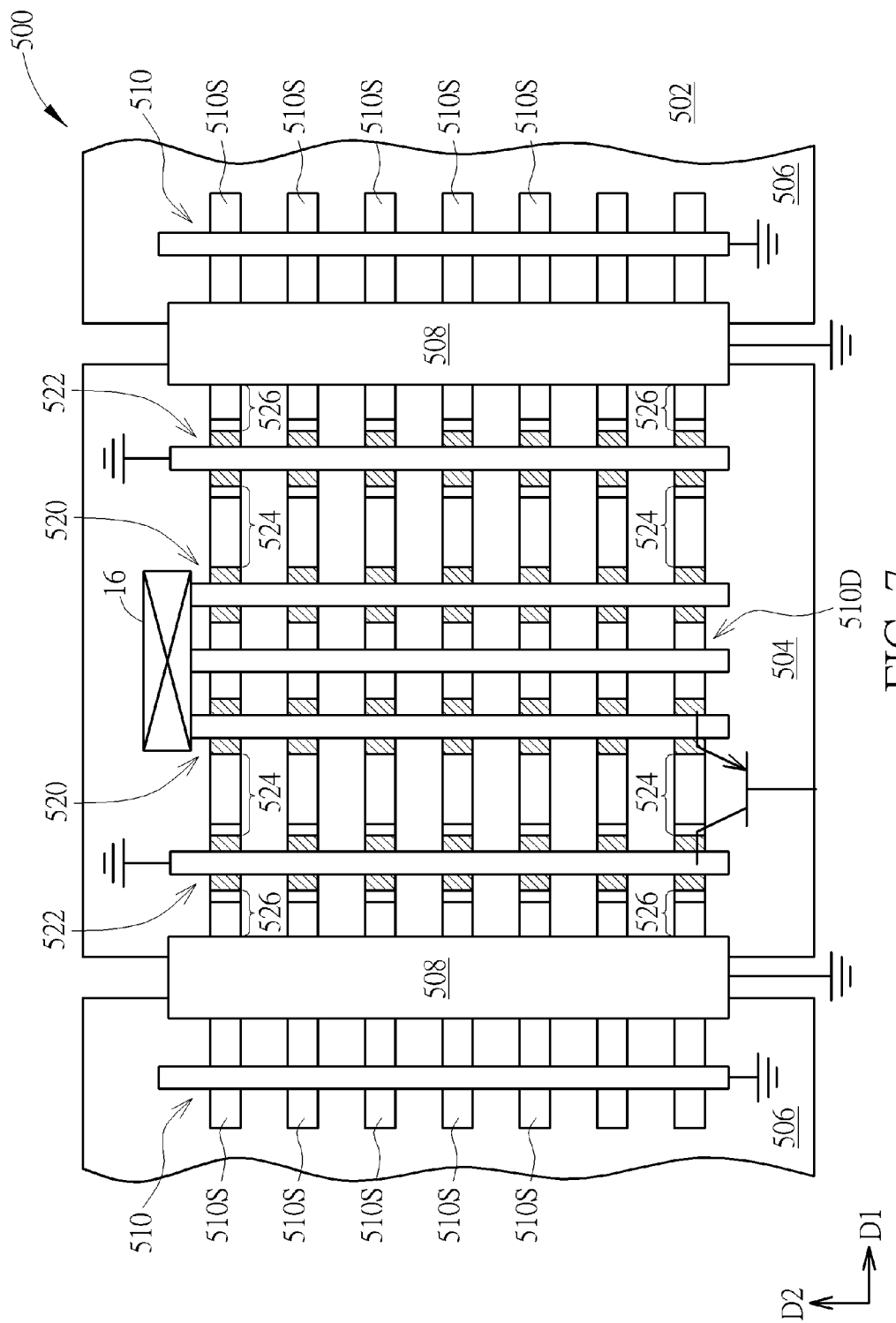
FIG. 7 is a schematic drawing illustrating a layout structure of an ESD protection semiconductor device provided by a fifth preferred embodiment of the present invention.

Please refer to FIG. 7, which is a schematic drawing illustrating a layout structure of an ESD protection semiconductor device provided by a fifth preferred embodiment of the present invention. As shown in FIG. 7, the preferred embodiment provides an ESD protection semiconductor device 500. The ESD protection semiconductor device 500 includes a substrate 502, and the substrate 502 includes a first well 504 and a second well 506 formed therein. And the first well 504 and the second well 506 are spaced apart from each other by the substrate 502 as shown in FIG. 7. The first well 504 includes a first conductivity type, the substrate 502 and the second well 506 include a second conductivity type, and the first conductivity type and the second conductivity type are complementary to each other. In some embodiments of the present invention, the first conductivity type is an n type and the second conductivity type is a p type. However, it is not limited to this as mentioned above. A gate 508 is formed on the substrate 502. Particularly, the gate 158 is positioned in between the first well 504 and the second well 506. And as shown in FIG. 7, the gate 508 overlaps a portion of the first well 504 and a portion of the second well 506. It is well-known to those skilled in the art that the gate 508 includes a gate conductive layer (not shown) and a gate dielectric layer (not shown), and since materials for the gate conductive layer and the gate dielectric layer are well-known to those skilled in the art, those details are omitted in the interest of brevity. The ESD protection semiconductor device 500 provided by the preferred embodiment further includes a plurality of fins 510 formed on the substrate 502. In the preferred embodiment, the fins 510 can be formed on the substrate 502 by performing multiple patterning process, such as, for example but not limited to, double patterning process. As shown in FIG. 7, the fins 510 are extended along a first direction D1 and arranged along a second direction D2. And the first direction D1 is perpendicular to the second direction. Furthermore, the gate 508 is extended along the second direction D2, and the gate 508 is formed to cover a portion of each fin 510.

Please still refer to FIG. 7. It is noteworthy that in the preferred embodiment, the fins 510 include a plurality of drain segments 510D respectively formed therein at a first side of the gate 508, and the drain segments 510D include the first conductivity type. The fins 510 further include a plurality of source segments 510S respectively formed therein at a second side of the gate 508 opposite to the first side, and the source segments 510S include the first conductivity type. In other words, the source segments 510S and the drain segments 510D are formed in the fins 510 at two opposite sides of the gate 508 as shown in FIG. 7.

Please still refer to FIG. 7. According to the preferred embodiment, the ESD protection semiconductor device 500 further include a plurality of first doped segments 520 and a plurality of second doped segments 522 formed in each fin 510 at the first side of the gate 508. In other words, the first doped segments 520, the second doped segments 522 and the drain segments 510D are all disposed at the same side. The first doped segments 520 and the second doped segments 522 include the second conductivity type, and a concentration of the first doped segments 520 and a concentration of the second doped segments 522 are the same. It is noteworthy that the first doped segments 520 directly and physically contact the drain segments 510. The second segments 522 are disposed in between the first segments 520 and the gate 510. However, the second doped segments 522 are spaced apart from both the first doped segments 520 and the gate 508. As shown in FIG. 7, the first doped segments 520 and the second doped segments 522 are spaced apart from each other by an insulating layer 524 and/or an undoped segment 524, respectively. Also as shown in FIG. 7, the second doped segments 522 and the gate 508 are spaced apart from each other by an insulating layer 526 and/or an undoped segment 526, respectively.

Please still refer to FIG. 7. According to embodiments of the present invention, wirings including contact plugs, vias and metal layers are formed to provide electrical connection between the elements. As shown in FIG. 7, the source segments 510S in each fin 510 can be grounded by wirings including contact plugs, vias and metal layer. In the same concept, the second doped segments 522 in each fin 510 can be grounded by wirings including contact plugs, vias and metal layer. And the drain segments 510D and the first doped segments 520 in each fin 510 can be electrically connected to a pad 16 such as an I/O pad or a VDD pad by wirings including contact plugs, vias and metal layer. Furthermore, the gate 508 can be also grounded by wirings including contact plugs, vias and metal layer.

Please refer to both of FIG. 1 and FIG. 7. When ESD event occurs, the first doped segments 520, the first well 504 and the second doped segments 522 construct the aforementioned first pnp-BJT 12, while the first doped segments 520, the first well 504, the substrate 502/the second well 506, and the source segments 510S construct the aforementioned pnpn-SCR 14 (the first doped segments 520, the first well 504 and the substrate 502/the second well 506 construct the aforementioned second pnp-BJT 14a, and the first well 504, the substrate 502/the second well 506 and the source segments 510S construct the aforementioned npn-BJT 14b). It is noteworthy that because concentrations of the first doped segments 520 and the second doped segments 522 are higher than a concentration of the first well 504, a breakdown voltage of the BJT 12 is smaller than a breakdown voltage of the SCR 14, and thus it is ensured that the BJT 12 is always firstly turned on. Consequently, the ESD current is bypassed from the first doped segments 520 to the first well 504 and then the second doped segments 522, and subsequently to the ground pad GND. Thereafter, as the voltage is increased, the SCR 14 is then turned on, and the ESD current is bypassed from the first doped segments 520 sequentially to the first well 504, the substrate 502/the second well 506 and the source segments 510S, and then to the ground pad GND.

According to the ESD protection semiconductor device and its layout structure 500, the first doped segments 520, the first well 504 and the second doped segments 522 form the parasite BJT 12 while the first doped segments 520, the first well 504, the second well 506/the substrate 502, and the source segments 510S form the SCR 14. And the BJT 12 and the SCR 14 are electrically connected in parallel. More important, the BJT 12 is turned on before the SCR 14 in an ESD event. Therefore a portion of the ESD current is bypassed by the BJT 12. When the voltage is increased, the SCR 14 is then turned on, and thus the holding current of the ESD protection circuit 10 is significantly increased. Briefly speaking, according to the ESD protection circuit 10, the ESD protection semiconductor device and the layout structure 500 of the ESD protection semiconductor device provided by the present invention, higher holding current and lower $R_{ON}$ are obtained by the parasite BJT 12 and the SCR 14, and latch-up immunity is consequently improved without increasing layout area. Additionally, since formation of the fins 510 can be integrated in the state-of-the-art semiconductor manufacturing process, no increase in process complexity and cost will be found.

According to the ESD protection semiconductor device and the layout structure of the ESD protection semiconductor device provided by the present invention, the first doped region and the second doped region, which are both formed in the first well but include conductivity type complementary to the first well are provided. Thus, a parasite BJT is formed by the first doped region, the first well and the second doped region. Furthermore, a SCR is formed by the first doped region, the first well, the second well and the source region. And the SCR is electrically connected to the BJT in parallel. More important, the BJT is always turned on before the SCR in an ESD event. Therefore a portion of the ESD current is bypassed. When the voltage is increased, the SCR is then turned on, and thus the holding current of the ESD protection circuit is significantly increased. According to the ESD protection circuit, the ESD protection semiconductor device and the layout structure of the ESD protection semiconductor device provided by the present invention, higher holding current is obtained, and latch-up immunity is consequently improved without increasing layout area by the parasite BJT and the SCR. Furthermore, the ESD protection semiconductor device provided by the present invention is able to be integrated into the state-of-the-art semiconductor manufacturing process, therefore the first doped region and the second doped region can formed in the first well without adding extra photomask. Furthermore, by adjusting width of the second doped region, lower $R_{ON}$ will be obtained. Additionally, the ESD protection semiconductor device provided by the present invention is able to be integrated into FinFET approaches. In other words, the ESD protection semiconductor device provided by the present invention can be integrated into planar or non-planar device approach depending on different requirements. That is, the present invention further improves both product flexibility and functionality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection semiconductor device, comprising:
    a substrate;
    a first well formed in the substrate, and the first well comprising a first conductivity type;
    a second well formed in the substrate and spaced apart from the first well, the second well comprising a second conductivity type, and the second conductivity type being complementary to the first conductivity type;
    a gate formed on the substrate and positioned in between the first well and the second well;
    a drain region formed in the first well and a source region formed in the second well, and the drain region and the source region comprising the first conductivity type;
    a first doped region formed in the first well and adjacent to the drain region, and the first doped region comprising the second conductivity type; and
    a second doped region formed in the first well and in between the first doped region and the gate, the second doped region being spaced apart from both the first doped region and the gate, and the second doped region comprising the second conductivity type.

2. The ESD protection semiconductor device according to claim 1, wherein the gate overlaps a portion of the first well and a portion of the second well.

3. The ESD protection semiconductor device according to claim 1, wherein the first doped region and the second doped region are spaced apart from each other by a shallow trench isolation (STI) or a salicide block (SAB).

4. The ESD protection semiconductor device according to claim 1, wherein the second doped region and the gate are spaced apart from each other by a STI or a portion of the first well.

5. The ESD protection semiconductor device according to claim 1, wherein the second doped region and the gate are spaced apart from each other by a blocking structure, and the blocking structure comprising a first STI and a second STI, the first STI is formed adjacent to the second doped region, and the gate overlaps a portion of the second STI.

6. The ESD protection semiconductor device according to claim 5, further comprising a third doped region formed in between the first STI and the second STI, and the third doped region comprising the first conductivity type.

7. The ESD protection semiconductor device according to claim 1, further comprising a pick-up region formed in the second well and spaced apart from the source region, and the pick-up region comprising the second conductivity type.

8. The ESD protection semiconductor device according to claim 7, wherein a concentration of the first doped region, a concentration of the second doped region and a concentration of the pick-up region are the same.

9. The ESD protection semiconductor device according to claim 7, wherein the second doped region, the source region, the pick-up region, and the gate are grounded.

10. The ESD protection semiconductor device according to claim 1, wherein the drain region and the first doped region are electrically connected to an I/O pad or a VDD pad.

11. A layout structure of an ESD protection semiconductor device comprising:
    a substrate;
    a first well formed in the substrate, and the first well comprising a first conductivity type;
    a second well formed in the substrate and spaced apart from the first well, the second well comprising a second conductivity type, and the second conductivity type being complementary to the first conductivity type;
    a plurality of fins formed on the substrate, the fins being extended along a first direction and arranged along a second direction, and the first direction and the second direction being perpendicular;
    a gate formed on the substrate and extended along the second direction, the gate covering a portion of each fin, a portion of the first well and a portion of the second well;
    a plurality of drain segments respectively formed in the fins at a first side of the gate, and the drain segments comprising the first conductivity type;
    a plurality of source segments respectively formed in the fins at a second side of the gate opposite to the first side, and the source segments comprising the first conductivity type;
    a plurality of first doped segments formed in the fins at the first side, and the first doped segments comprising the second conductivity type; and
    a plurality of second doped segments formed in the fins at the first side, the second doped segments comprising the second conductivity type and being spaced apart from the first doped segments and the gate.

12. The layout structure of the ESD protection semiconductor device according to claim 11, wherein the first doped segments are spaced apart from the second doped segments by an insulating layer and/or an undoped segment, respectively.

13. The layout structure of the ESD protection semiconductor device according to claim 11, wherein the second doped segments are spaced apart from the gate by an insulating layer and/or an undoped segment, respectively.

14. The layout structure of the ESD protection semiconductor device according to claim 11, wherein the drain segments and the first doped segments are electrically connected to an I/O pad or a VDD pad.

15. The layout structure of the ESD protection semiconductor device according to claim 11, wherein the second doped segments are grounded.

16. The layout structure of the ESD protection semiconductor device according to claim 11, wherein the source segments are grounded.

* * * * *